United States Patent
Kimura et al.

(10) Patent No.: US 10,886,157 B2
(45) Date of Patent: Jan. 5, 2021

(54) WAFER HOLDING UNIT (71) Applicant: SUMITOMO ELECTRIC INDUSTRIES, LTD., Osaka (JP)

(72) Inventors: Koichi Kimura, Itami (JP); Shigenobu Sakita, Itami (JP); Kenji Shinma, Itami (JP); Daisuke Shimao, Itami (JP); Katsuhiro Itakura, Itami (JP); Masuhiro Natsuhara, Itami (JP); Akira Mikumo, Itami (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 391 days.

(21) Appl. No.: 15/739,061

(22) PCT Filed: Jul. 1, 2016

(86) PCT No.: PCT/JP2016/069570
§ 371 (c)(1),
(2) Date: Dec. 21, 2017

(87) PCT Pub. No.: WO2017/010307
PCT Pub. Date: Jan. 19, 2017

(65) Prior Publication Data
US 2018/0174878 A1 Jun. 21, 2018

(30) Foreign Application Priority Data
Jul. 13, 2015 (JP) .................. 2015-139738

(51) Int. Cl.
H01L 21/683 (2006.01)
C23C 16/458 (2006.01)
(Continued)

(52) U.S. Cl.
CPC .......... H01L 21/6831 (2013.01); C23C 14/50 (2013.01); C23C 14/541 (2013.01);
(Continued)

(58) Field of Classification Search
CPC . H01L 21/6831; H01L 21/3065; H01L 21/31; H01L 21/67103; G03F 7/707;
(Continued)

(56) References Cited

U.S. PATENT DOCUMENTS 5,688,331 A * 11/1997 Aruga ............... C23C 16/45521
118/725
5,817,406 A * 10/1998 Cheung ............... C23C 16/4586
428/210
(Continued)

FOREIGN PATENT DOCUMENTS

| JP | 1998-209255 A | 8/1998 |
| JP | H10-273371 A | 10/1998 |

(Continued)

OTHER PUBLICATIONS

Search Report in the corresponding International Patent Application No. PCT/JP2016/069570 dated Sep. 27, 2016.

*Primary Examiner* — Paul R Durand
*Assistant Examiner* — Andrew P Bainbridge
(74) *Attorney, Agent, or Firm* — Global IP Counselors, LLP (57) ABSTRACT

A wafer holding unit includes a disk-shaped ceramic substrate having a wafer mounting surface on an upper surface of the substrate, an RF electrode, for example, embedded within the substrate, a metal terminal inserted from a lower surface of the substrate, and a connecting terminal which electrically connects the RF electrode and the metal terminal with each other. The connecting terminal is constituted by a ceramic member and a metal layer. The ceramic member is made of the same material as the substrate and preferably has a truncated conical shape. The metal layer covers a surface of the ceramic member. An upper end of the metal layer is connected to the RF electrode, while a lower end of (Continued)

the metal layer is connected to the metal terminal with a metal member interposed therebetween.

8 Claims, 5 Drawing Sheets

(51) Int. Cl.
| | |
|---|---|
| *C23C 16/509* | (2006.01) |
| *H01L 21/3065* | (2006.01) |
| *H01L 21/31* | (2006.01) |
| *C23C 14/50* | (2006.01) |
| *H01L 21/67* | (2006.01) |
| *C23C 16/46* | (2006.01) |
| *C23C 14/54* | (2006.01) |
| *G03F 7/20* | (2006.01) |

(52) U.S. Cl.
CPC ........ *C23C 16/458* (2013.01); *C23C 16/4581* (2013.01); *C23C 16/4586* (2013.01); *C23C 16/46* (2013.01); *C23C 16/509* (2013.01); *H01L 21/3065* (2013.01); *H01L 21/31* (2013.01); *H01L 21/67103* (2013.01); *G03F 7/707* (2013.01)

(58) Field of Classification Search
CPC ..... C23C 14/50; C23C 14/541; C23C 16/458; C23C 16/4581; C23C 16/4586; C23C 16/46; C23C 16/509
USPC ......... 219/444.1, 461.1, 465.1, 466.1, 467.1, 219/468.1; 338/307–308, 314; 118/724, 118/725
See application file for complete search history.

(56) References Cited

U.S. PATENT DOCUMENTS

| | | | | |
|---|---|---|---|---|
| 6,101,969 A | * | 8/2000 | Niori | H01J 37/32559 118/723 E |
| 6,358,573 B1 | * | 3/2002 | Raoux | C23C 16/5096 427/578 |
| 7,098,428 B1 | * | 8/2006 | Elliot | C23C 16/4586 118/724 |
| 2015/0380526 A1 | * | 12/2015 | Godet | H01L 29/66795 438/482 |

FOREIGN PATENT DOCUMENTS

| | | |
|---|---|---|
| JP | 2003-045952 A | 2/2003 |
| JP | 2003-086663 A | 3/2003 |
| JP | 2005-026120 A | 1/2005 |
| JP | 2007-005740 A | 6/2005 |
| JP | 2006-287213 A | 3/2006 |
| JP | 2006-191124 A | 7/2006 |
| JP | 2006-287213 A | 10/2006 |
| JP | 2007-005740 A | 1/2007 |
| JP | 2008-305968 A | 12/2008 |
| JP | 2012-204497 A | 10/2012 |
| JP | 2014-222697 A | 11/2014 |

\* cited by examiner

WAFER HOLDING UNIT

This U.S. National stage application of PCT/JP2016/069570 filed Jul. 1, 2016, claims priority under 35 U.S.C. § 119(a) to Japanese Patent Application No. 2015-139738, filed on Jul. 13, 2015, the entire contents of which are incorporated herein by reference.

TECHNICAL FIELD

The present invention relates to a wafer holding unit.

BACKGROUND ART

PTL 1 discloses a susceptor including a ceramic member having an embedded conductive member therein corresponding to a heater electrode, for example.

PTL 2 discloses the following ceramic susceptor. Screw holes are formed in portions on the lower surface of a disk-shaped ceramic substrate including electric circuits therein so as to expose the electric circuits. Metal terminals (anchor members) are screwed into these screw holes, so that one end of each of the metal terminals can be connected to the corresponding electric circuit and the other ends of the metal terminals can be connected to power-supply conductive members.

PTL 3 discloses a technology for connecting a metal terminal inserted from the lower surface of a ceramic wafer holding unit to an electrode embedded within the ceramic wafer holding unit via a connecting terminal.

CITATION LIST

Patent Literature

PTL 1: Japanese Unexamined Patent Application Publication No. 10-273371
PTL 2: Japanese Unexamined Patent Application Publication No. 2003-086663
PTL 3: Japanese Unexamined Patent Application Publication No. 2008-305968

SUMMARY OF INVENTION

A wafer holding unit provided by the present disclosure includes a disk-shaped ceramic substrate having a wafer mounting surface on an upper surface of the substrate, an electrode embedded within the substrate, a metal terminal inserted from a lower surface of the substrate, and a connecting terminal which electrically connects the electrode and the metal terminal with each other. The connecting terminal is constituted by a ceramic member and a metal layer. The ceramic member is made of the same material as the substrate. The metal layer covers a surface of the ceramic member. An upper end of the metal layer is connected to the electrode, while a lower end of the metal layer is connected to the metal terminal with a metal member interposed therebetween.

DESCRIPTION OF EMBODIMENTS

Technical Problem

In accordance with increased performance of recent electronic devices, in a semiconductor device manufacturing process, it is desirable to perform film deposition under higher temperatures and high-efficiency film deposition by using plasma with the application of increased voltages to an RF electrode. To satisfy such a demand, a wafer holding unit, such as those described above, desirably has a structure in which more reliable power supply to an embedded heater electrode or an embedded RF electrode than in the related art is achieved without any failures, such as breakage caused by a difference in the thermal expansion.

The present invention has been made in view of this background. It is an object of the present invention to provide a high-reliability ceramic wafer holding unit including a heater circuit and an RF electrode therein, in which power is reliably supplied to the heater circuit and the RF electrode from the outside, and also, breakage, which would be caused by a difference in the thermal expansion, is less likely to occur in the heater circuit and the RF electrode.

Advantageous Effects of the Disclosure

According to the present invention, it is possible to reliably supply power to electrodes embedded in a ceramic substrate without any breakage, which would be caused by a difference in the thermal expansion.

Description of Embodiments of the Invention of this Application

Embodiments of the present invention will first be described below. A wafer holding unit according to an embodiment of the present invention includes a disk-shaped ceramic substrate having a wafer mounting surface on an upper surface of the substrate, an electrode embedded within the substrate, a metal terminal inserted from a lower surface of the substrate, and a connecting terminal which electrically connects the electrode and the metal terminal with each other. The connecting terminal is constituted by a ceramic member and a metal layer. The ceramic member is made of the same material as the substrate. The metal layer covers a surface of the ceramic member. An upper end of the metal layer is connected to the electrode, while a lower end of the metal layer is connected to the metal terminal with a metal member interposed therebetween. This configuration makes is possible to reliably supply power to the electrode embedded in the ceramic substrate without any breakage, which would be caused by a difference in the thermal expansion. It is preferable that the surface of the ceramic member be entirely covered by the metal layer in terms of reducing the electrical resistance. The above-described disk shape is not limited to a precise true circle, and includes an elliptical shape, which is represented by the major axis and the minor axis, and a substantially elliptical shape.

In the wafer holding unit according to an embodiment of the present invention, the metal terminal may be screwed with the substrate. Alternatively, the metal terminal may be screwed with the metal member. If the metal terminal is screwed with the substrate, it can firmly be fixed with a simple structure. If the metal terminal is screwed with the metal member, the area of contact between the metal terminal and the metal member is increased, thereby further decreasing the resistance.

In the wafer holding unit according to an embodiment of the present invention, the ceramic member of the connecting terminal may preferably have a truncated conical shape. With this configuration, when fabricating the wafer holding unit, the connecting terminal can easily be brought into close contact with the substrate without any gap therebetween.

Additionally, the connecting terminal can be prevented from being displaced toward the wafer mounting surface. This can prevent the connecting terminal from pressing the portion of the ceramic substrate positioned above the electrode, which receives power via the connecting terminal, thereby eliminating the occurrence of defects, such as warpage or cracks, in this portion of the ceramic substrate.

In the wafer holding unit according to an embodiment of the present invention, the electrode may be an RF plasma-forming electrode, a heater electrode, or an electrostatic chuck electrode. In any of these electrodes, the above-described various advantages can be obtained.

A wafer holding unit 10 according to a first specific example of the present invention will be described below with reference to FIG. 1. The wafer holding unit 10 according to the first specific example of the present invention includes a disk-shaped substrate 11, an RF electrode 12, a metal terminal 13, and a connecting terminal 14. The substrate 11 has a wafer mounting surface 11a on the upper surface of the substrate 11. On the wafer mounting surface 11a, a semiconductor wafer (not shown), which is a subject to be processed, is mounted. The RF electrode 12 is embedded within the substrate 11. The metal terminal 13 is inserted in the substrate 11 from the lower surface thereof. The connecting terminal 14 electrically connects the RF electrode 12 and the metal terminal 13 with each other.

The individual elements will be specifically described below. The substrate 11 is typically a member horizontally supported by a tubular support member from downward. As the material for the substrate 11, ceramics having high stiffness and high thermal conductivity, such as aluminum nitride, silicon nitride, silicon carbide, or aluminum oxide, is preferably used, and aluminum nitride is more preferably used.

The RF electrode 12, which is used for creating an atmosphere of plasma above the wafer mounting surface 11a during film deposition, is embedded within the substrate 11 on a level parallel with the wafer mounting surface 11a. In order to ground the RF electrode 12 or supply power thereto, the metal terminal 13 is inserted in the substrate 11 such that the lower end of the metal terminal 13 protrudes from the lower surface of the substrate 11. The external surface of at least the upper end of the metal terminal 13 is threaded, and is engaged with a screw hole of the substrate 11 into which the metal terminal 13 is screwed. Conductive wires, which are not shown, are connected to the protruding lower end of the metal terminal 13. A heater electrode 15, which is used for heating a semiconductor wafer mounted on the wafer mounting surface 11a, is also embedded within the substrate 11 such that it is separated from the RF electrode 12 and is placed farther downward than the RF electrode 12. The structure in which power is supplied to the heater electrode 15 may be similar to that for the RF electrode 12, or a typical terminal structure may be used for the heater electrode 15. Either of the structures may be used, and an explanation thereof will be omitted.

The connecting terminal 14 constituted by a ceramic member 14a and a metal layer 14b is also embedded within the substrate 11. The ceramic member 14a has a truncated conical shape and is made of the same material as the substrate 11. The metal layer 14b covers the entirety of the lateral surface of the ceramic member 14a. The connecting terminal 14 is embedded within the substrate 11 in the state in which the central axis of the connecting terminal 14 is parallel with the thickness direction of the substrate 11. The tapered leading end surface of the connecting terminal 14 abuts against the lower side of the RF electrode 12, while the tapered back end surface of the connecting terminal 14 abuts against the upper end surface of the metal terminal 13 with a disk-shaped metal member 16 interposed therebetween.

As described above, the ceramic member 14a is made of the same material as the substrate 11. Because of this configuration, the difference in the thermal expansion becomes almost zero in a wide range of temperatures. A thermal stress is thus less likely to be produced between the connecting terminal 14 and the area around thereof. As a result, breakage, such as cracks, is less likely to occur in a wafer holding unit including a thin substrate 11. The ceramic member 14a may be formed in another shape, such as a cylinder, a prism, a column having an enlarged or reduced intermediate portion, or a truncated pyramid. However, the above-described truncated conical shape is most preferable because a higher-reliability connecting terminal structure can easily be formed with this shape.

The material for the above-described metal layer 14b and metal member 16 and the material for the above-described RF electrode 12 and heater electrode 15 are preferably tungsten (W), molybdenum (Mo), or an alloy thereof, apart from incidental impurities. The reason for this is that the difference in the coefficient of thermal expansion between any of these metals and ceramics forming the substrate 11 is relatively small, thereby making it possible to reduce the occurrence of defects, such as warpage or cracks in the wafer holding unit. The material for the metal terminal 13 is preferably at least one metal or at least one alloy selected from the group consisting of tungsten, molybdenum, an alloy thereof, nickel, Kovar, a copper-tungsten alloy, a copper-molybdenum alloy, and a copper-nickel-iron-tungsten alloy, apart from incidental impurities.

As the above-described disk-shaped metal member 16 abutting against the back end surface of the connecting terminal 14, a metal member having an outer diameter greater than that of the back end surface of the connecting terminal 14 is used. With this configuration, while the loop-like upper end of the metal layer 14b entirely abuts against the RF electrode 12, the loop-like lower end of the metal layer 14b of the connecting terminal 14 can entirely abut against the metal member 16. Thus, more reliable electrical connection between the upper end of the metal terminal 13 and the RF electrode 12 is achieved than in a known power supply terminal. Failures, such as local generation of Joule heating, will less likely to occur during power supply. The metal member 16 is not restricted to a disk shape. The metal member 16 may alternatively be a member having another shape, such as a polygonal planar member or loop-like member, if the loop-like lower end of the metal layer 14b can entirely abut against the metal member 16.

The above-described wafer holding unit can be fabricated by the following method. First, three ceramic substrates made of the same material and having the same outer diameter are prepared. A through-hole 11B is formed in one of these substrates at a position at which the above-described connecting terminal 14 will be embedded. This through-hole 11B is formed in a tapered structure in which the inner diameter gradually becomes smaller toward the wafer mounting surface 11a. Then, a ceramic member made of the same material as the above-described ceramic substrate is prepared. This ceramic member has a truncated conical shape having a tapered structure so that it can fit into the through-hole 11B. The lateral surface of the ceramic member is coated with a metal layer having substantially the same thickness along the entire circumference.

The lateral surface of the ceramic member may be coated with a metal layer in the following manner. Metallizing may be performed for applying a tungsten paste to the lateral surface of the ceramic member and firing the tungsten paste, so that a tungsten layer having a thickness of about 10 to 50 μm may coat the lateral surface of the ceramic member. Alternatively, a tungsten-made sleeve member having a thickness of about 50 μm to 2 mm may be separately formed and then be attached to the lateral surface of the ceramic member. The ceramic member coated with the metal layer in this manner is inserted into the through-hole 11B of the substrate and is brought into closer contact with the substrate. As a result, almost no gap is formed around the ceramic member coated with the metal layer, thereby preventing the entry of plasma into the wafer holding unit.

The upper and lower ends of the metal layer are exposed in a loop-like shape on the front and back surfaces of the ceramic substrate. In order to form an RF electrode on the front surface and a heater electrode on the back surface of the ceramic substrate, patterning layers of a tungsten paste, for example, are applied to the front and back surfaces of the ceramic substrate by screen printing. After the application of a tungsten paste, the patterning layers are dried and are then dewaxed under an atmosphere of nitrogen at a temperature of about 800° C. The remaining two substrates are overlaid on the front and back surfaces of the ceramic substrate, and then, the three substrates are hot-pressed under an atmosphere of nitrogen at a temperature of about 1800° C. As a result, an integrated disk-shaped body including integrated three ceramic substrates is obtained.

Then, a counterbore 11C having an inner diameter that can accommodate a metal terminal is formed from the lower surface of this integrated disk-shaped body toward the ceramic member, so that the lower end of the ceramic member is exposed together with the metal layer coating the lateral surface of the ceramic member. The counterbore 11C and the through-hole 11B can be co-axial aligned with one another. Then, a metal member is bonded to the lower end of the exposed metal layer and ceramic member by brazing, and more preferably, by metallizing using tungsten. Further, a metal terminal having a threaded leading end is screwed into the counterbore 11C. While screwing the metal terminal, this threaded leading end is caused to abut against the lower surface of the metal member. As a result, a wafer holding unit is fabricated.

Figure 2:
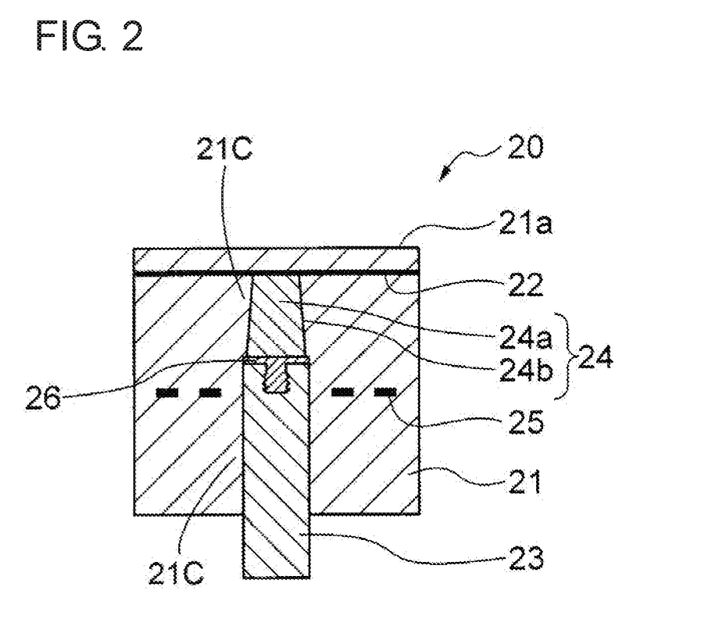
FIG. 2 is a longitudinal sectional view partially and schematically illustrating a second specific example of a wafer holding unit according to the present invention.

A wafer holding unit according to a second specific example of the present invention will now be described below. As shown in FIG. 2, in a wafer holding unit 20 according to the second specific example of the present invention, a metal terminal 23 inserted into a counterbore 21C of a substrate 21 are not screwed with each other, and instead, the metal terminal 23 and a metal member 26 are screwed with each other. Except for this characteristic, the structure of the wafer holding unit 20 is basically similar to that of the wafer holding unit 10 according to the first specific example of the present invention.

More specifically, the wafer holding unit 20 includes a disk-shaped substrate 21, an RF electrode 22, a metal terminal 23, a connecting terminal 24, and a heater electrode 25. The substrate 21 is made of aluminum nitride, for example, and has a wafer mounting surface 21a on the upper surface thereof. The RF electrode 22 is embedded within the substrate 21. The metal terminal 23 is inserted in the substrate 21 from the lower surface thereof. The connecting terminal 24 is inserted into a truncated conical shaped through-hole 21B and electrically connects the RF electrode 22 and the metal terminal 23 with each other. The heater electrode 25 is embedded within the substrate 21 such that it is separated from the RF electrode 22 and is placed farther downward than the RF electrode 22. The connecting terminal 24 is constituted by a ceramic member 24a and a metal layer 24b. The ceramic member 24a has a truncated conical shape and is made of the same material as the substrate 21. The metal layer 24b covers the entirety of the lateral surface of the ceramic member 24a. The tapered leading end surface of the connecting terminal 24 abuts against the lower side of the RF electrode 22, while the tapered back end surface of the connecting terminal 24 is electrically connected to the upper end surface of the metal terminal 23 with a disk-shaped metal member 26 interposed therebetween. The counterbore 21C and the through-hole 21B can be co-axial aligned with one another.

The metal terminal 23 and the metal member 26 may be screwed with each other in the following manner. As shown in FIG. 2, a male thread protruding downward may be provided on the lower surface of the metal member 26, while a female thread which is screwed with the male thread may be provided on the forward end of the metal member 26. Conversely, a male thread protruding upward may be provided on the forward end of the metal member, while a female thread which is screwed with the male thread may be provided on the lower surface of the metal member. In whichever case, the area of contact between the metal terminal and the metal member is increased, thereby further decreasing the resistance.

Figure 3A:
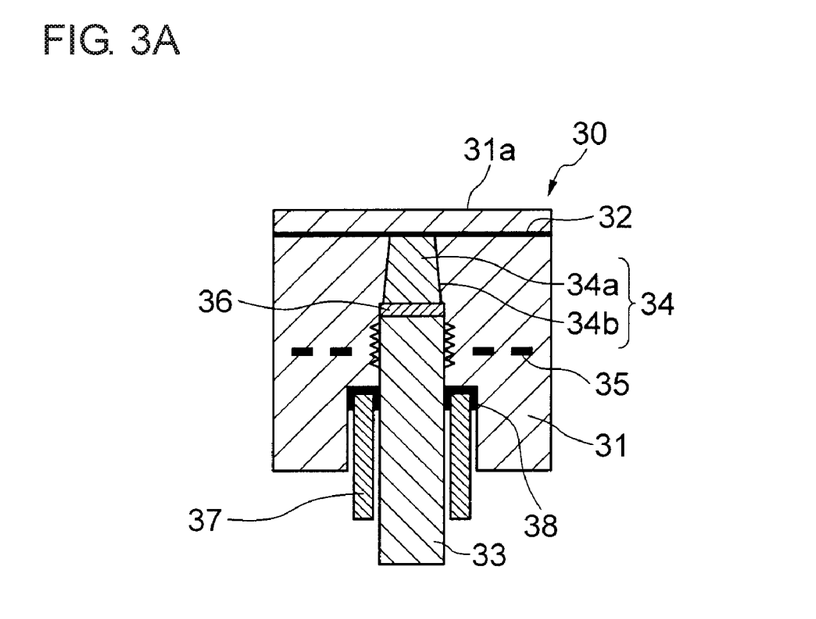
FIG. 3A is a longitudinal sectional view partially and schematically illustrating a third specific example of a wafer holding unit according to the present invention.

A wafer holding unit according to a third specific example of the present invention will now be described below. As shown in FIG. 3A, in a wafer holding unit 30 according to the third specific example of the present invention, by providing a step portion in a screw hole of a substrate 31 into which a metal terminal 33 is inserted, the inner diameter of the screw hole is partially enlarged at the opening side of the substrate 31. A tubular sealing member 37 is fit into this enlarged portion such that it surrounds the metal terminal 33.

Then, glass 38 seals the area between the loop-like forward end of the sealing member 37 and the step portion of the screw hole. This configuration can protect from adverse influences, such as corrosion, caused by the entry of air and atmospheric gases into the area where the metal terminal 33 and the substrate 31 are screwed with each other.

The structure of the wafer holding unit according to the third specific example of the present invention is basically similar to that of the wafer holding unit 10 according to the first specific example of the present invention, except for the above-described tubular sealing member 37 and glass 38. More specifically, the wafer holding unit 30 includes a disk-shaped substrate 31, an RF electrode 32, a metal terminal 33, a connecting terminal 34, and a heater electrode 35. The substrate 31 is made of aluminum nitride, for example, and has a wafer mounting surface 31a on the upper surface thereof. The RF electrode 32 is embedded within the substrate 31. The metal terminal 33 is inserted in the substrate 31 from the lower surface thereof. The connecting terminal 34 electrically connects the RF electrode 32 and the metal terminal 33 with each other. The heater electrode 35 is embedded within the substrate 31 such that it is separated from the RF electrode 32 and is placed farther downward than the RF electrode 32. The connecting terminal 34 is constituted by a ceramic member 34a and a metal layer 34b. The ceramic member 34a has a truncated conical shape and is made of the same material as the substrate 31. The metal layer 34b covers the entirety of the lateral surface of the ceramic member 34a. The tapered leading end surface of the connecting terminal 34 abuts against the lower side of the RF electrode 32, while the tapered back end surface of the connecting terminal 34 is electrically connected to the upper end surface of the metal terminal 33 with a disk-shaped metal member 36 interposed therebetween.

Figure 3B:
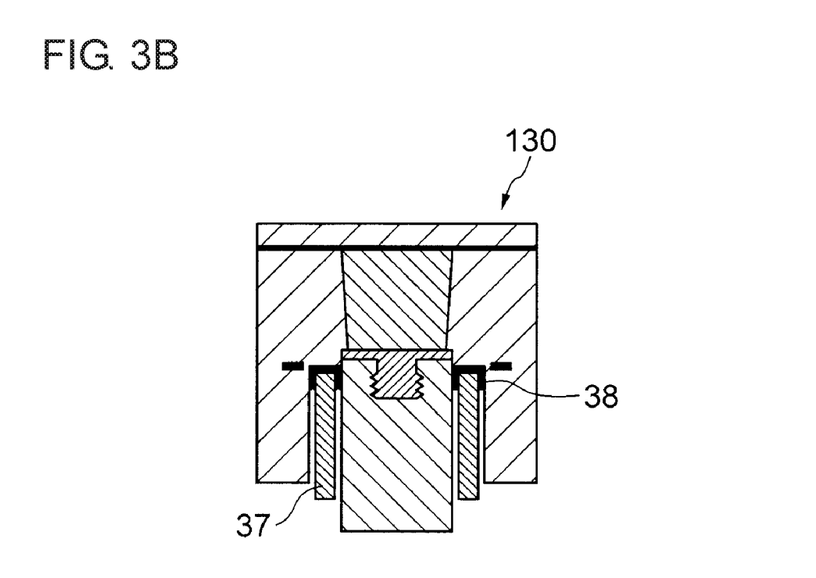
FIG. 3B is a longitudinal sectional view partially and schematically illustrating another third specific example of a wafer holding unit according to the present invention.
Figure 3C:
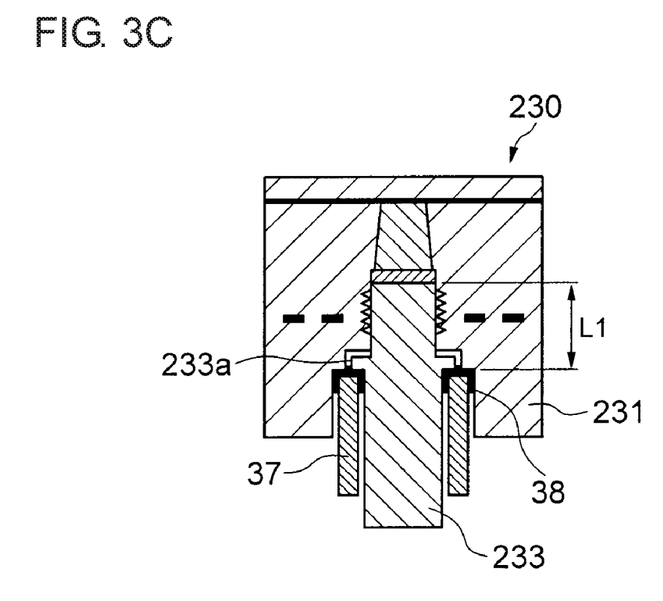
FIG. 3C is a longitudinal sectional view partially and schematically illustrating another third specific example of a wafer holding unit according to the present invention.

The sealing structure using the tubular sealing member and glass may be applied to the power supply terminal structure in a wafer holding unit 130 shown in FIG. 3B, such as that of the second specific example. As in a wafer holding unit 230 shown in FIG. 3C, a flange 233a may be formed in a metal terminal 233 at a position of a step portion of the screw hole of a substrate 231. Then, the forward end surface of the tubular sealing member 37 is positioned such that it opposes the lower surface of the flange 233a and the surface of the step portion of the screw hole, and glass 38 is charged into the area where the tubular sealing member 37 opposes the flange 233a and the step portion. In this case, the sealing surface made by the glass 38 becomes perpendicular to the direction in which the tubular sealing member 37 presses, thereby achieving more reliable sealing.

Figure 3D:
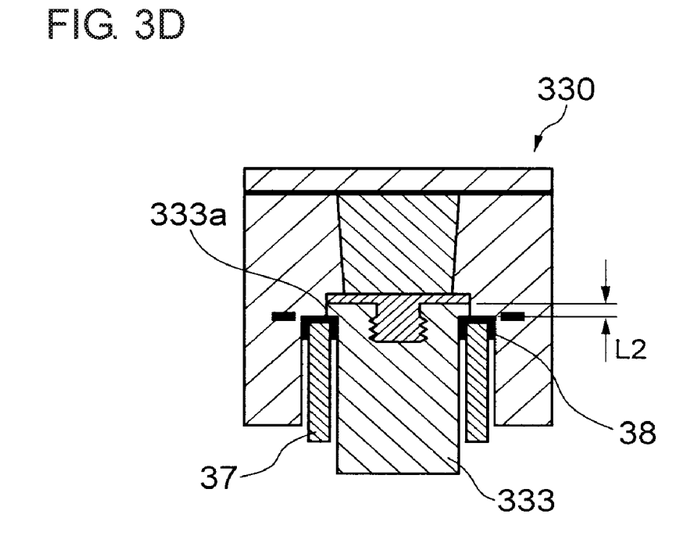
FIG. 3D is a longitudinal sectional view partially and schematically illustrating another third specific example of a wafer holding unit according to the present invention.

If a wafer holding unit is configured such that a flange is formed in a metal terminal to seal as described above, the power supply terminal structure according to the second specific example is preferably employed. The reason for this is as follows. It is seen that, upon comparing the above-described wafer holding unit 230 shown in FIG. 3C with a wafer holding unit 330 shown in FIG. 3D using the second specific example, the distance L2 between the forward end of a metal terminal 333 fixed to a substrate and a flange 333a in the wafer holding unit 330 can be made shorter than the distance L1 between the metal terminal 233 and the flange 233a in the wafer holding unit 230. With the configuration of the wafer holding unit 330, the influence of the difference in the thermal expansion between the substrate and the metal terminal made of different materials can be reduced to be smaller.

Figure 4A:
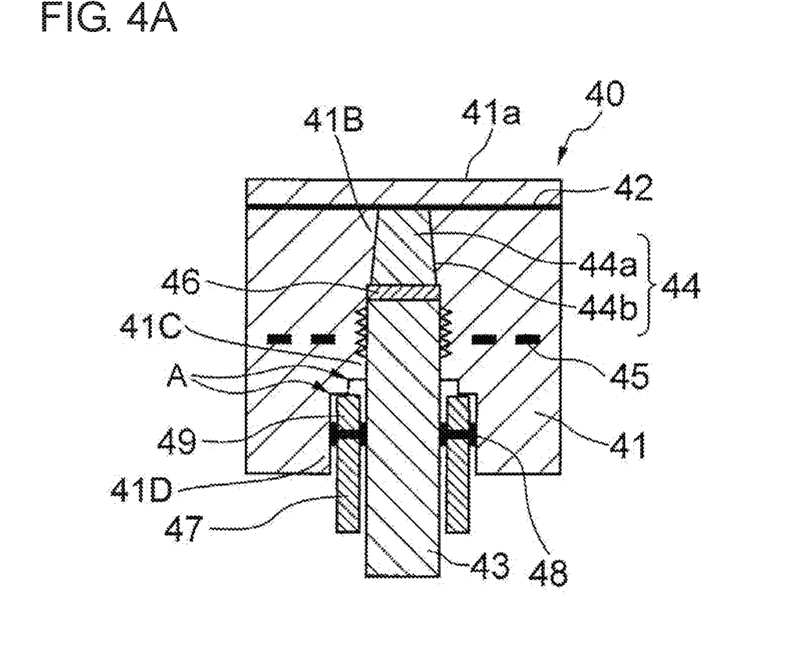
FIG. 4A is a longitudinal sectional view partially and schematically illustrating a fourth specific example of a wafer holding unit according to the present invention.

A wafer holding unit according to a fourth specific example of the present invention will now be described below. As shown in FIG. 4A, in a wafer holding unit 40 according to the fourth specific example of the present invention, a loop-like member 49 having substantially the same diameter of a tubular sealing member 47 which is fit around a metal terminal 43 is provided on the upper portion of the tubular sealing member 47. Instead of charging glass into the area between the loop-like member 49 and a step portion of a screw hole, glass 48 is charged into the area between the sealing member 47 and the loop-like member 49.

The structure of the wafer holding unit according to the fourth specific example of the present invention is basically similar to that of the wafer holding unit 10 according to the first specific example of the present invention, except for the above-described tubular sealing member 47, loop-like member 49, and glass 48. More specifically, the wafer holding unit 40 includes a disk-shaped substrate 41, an RF electrode 42, a metal terminal 43, a connecting terminal 44, and a heater electrode 45. The substrate 41 is made of aluminum nitride, for example, and has a wafer mounting surface 41a on the upper surface thereof. The substrate 41 includes a through-hole 41B, a first counterbore 41C and a second counterbore 41D that can be co-axially aligned with one another. The RF electrode 42 is embedded within the substrate 41. The metal terminal 43 is inserted into the first counterbore 41C of the substrate 41 from the lower surface thereof. The connecting terminal 44 is inserted into the through-hole 41B and electrically connects the RF electrode 42 and the metal terminal 43 with each other. The heater electrode 45 is embedded within the substrate 41 such that it is separated from the RF electrode 42 and is placed farther downward than the RF electrode 42. The connecting terminal 44 is constituted by a ceramic member 44a and a metal layer 44b. The ceramic member 44a has a truncated conical shape and is made of the same material as the substrate 41. The metal layer 44b covers the entirety of the lateral surface of the ceramic member 44a. The tapered leading end surface of the connecting terminal 44 abuts against the lower side of the RF electrode 42, while the tapered back end surface of the connecting terminal 44 is electrically connected to the upper end surface of the metal terminal 43 with a disk-shaped metal member 46 interposed therebetween. The sealing member 47 is inserted into the second counterbore 41D surrounding the metal terminal 43.

Figure 4B:
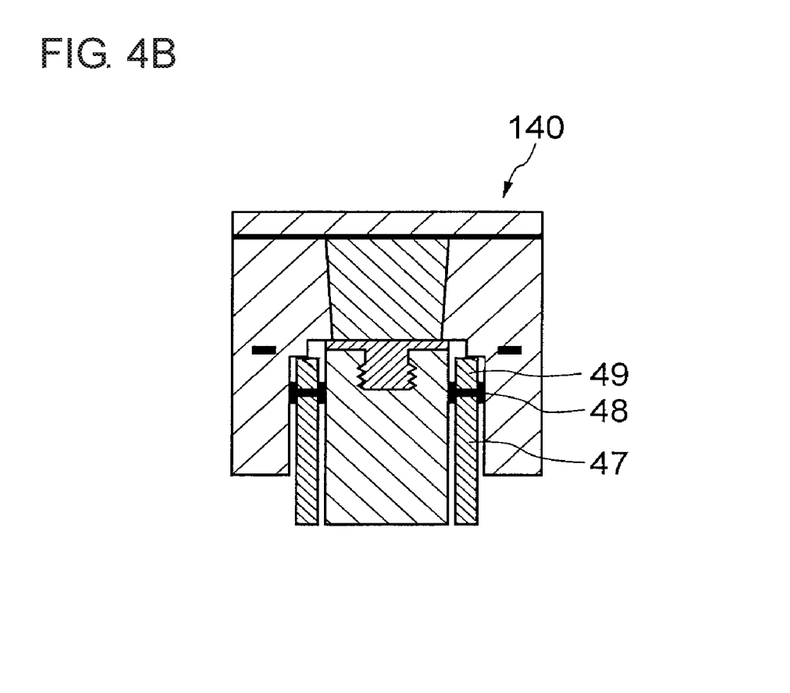
FIG. 4B is a longitudinal sectional view partially and schematically illustrating another fourth specific example of a wafer holding unit according to the present invention.
Figure 4C:
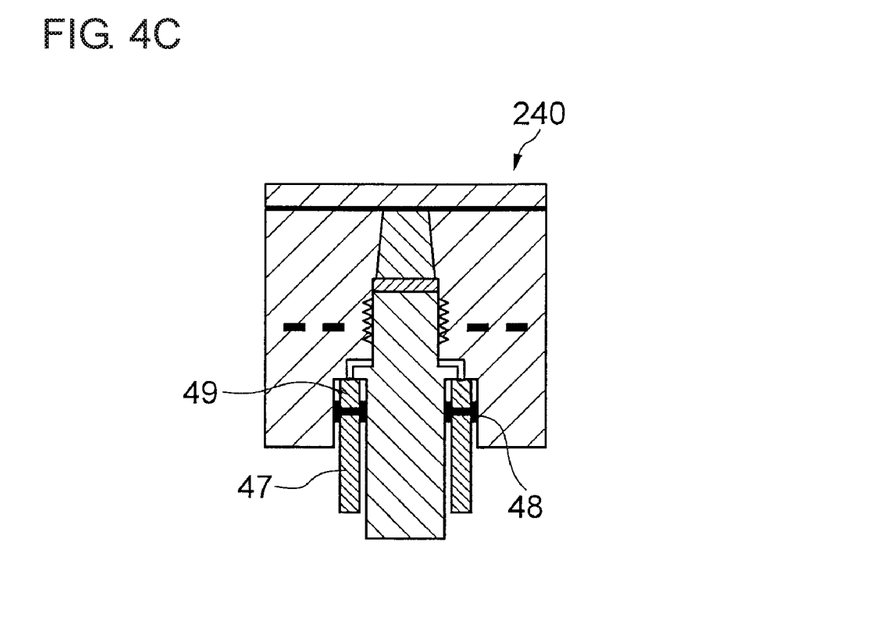
FIG. 4C is a longitudinal sectional view partially and schematically illustrating another fourth specific example of a wafer holding unit according to the present invention.
Figure 4D:
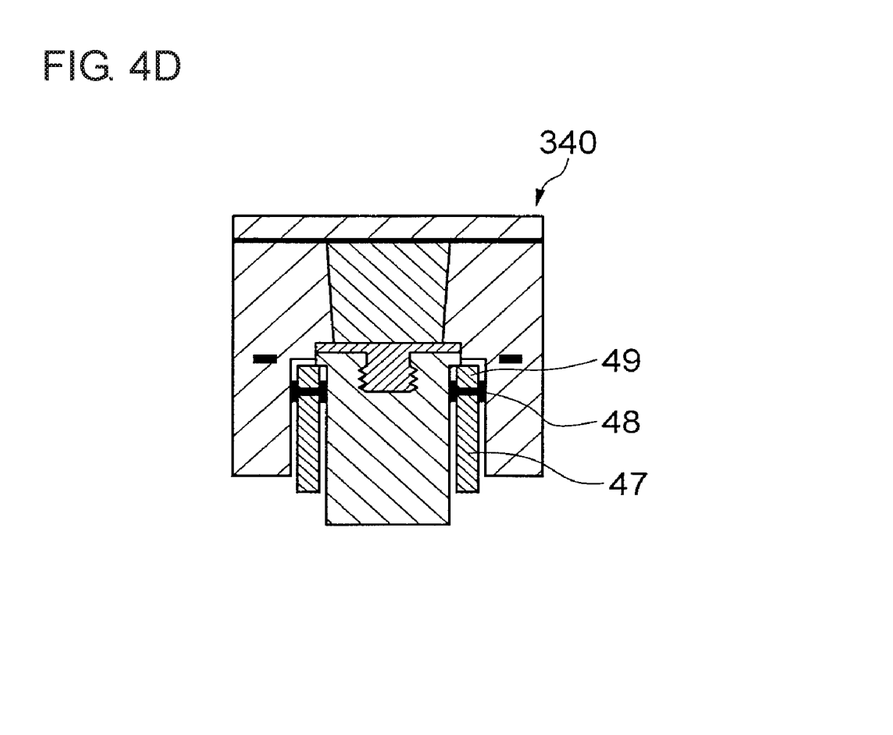
FIG. 4D is a longitudinal sectional view partially and schematically illustrating another fourth specific example of a wafer holding unit according to the present invention.

If glass is charged into corners A of a certain portion, such as a step portion of a screw hole of a ceramic substrate, stress may be concentrated on the glass at the corners A, which may crack the glass. However, by charging glass into the area between the sealing member and the loop-like member as described above, the need to charge glass into the corners A is eliminated, thereby achieving more reliable sealing. In this case, it is more preferable that the corners A of the step portion of the screw hole be formed by a gentle curve. Wafer holding units 140, 240, and 340 shown in FIGS. 4B through 4D respectively correspond to the wafer holding units 130, 230, and 330 of the third specific example shown in FIGS. 3B through 3D. In the wafer holding units 40, 140, 240, and 340, in addition to the advantages of the third specific example, the advantage achieved by this two-piece sealing member is obtained.

The wafer holding units of the present invention have been described through illustration of plural specific examples. However, the present invention is not restricted to these specific examples, and may be carried out in various modes without departing from the spirit and the scope of the present invention. For example, in the wafer holding units of the above-described specific examples, electrodes embedded within a substrate (embedded electrodes) are an RF electrode for forming plasma and a heater electrode. Instead of one of these electrodes or in addition to at least one of these electrodes, an electrostatic chuck electrode may be embedded, and the above-described power supply terminal structure may be applied to at least one of these electrodes.

Examples

Figure 1:
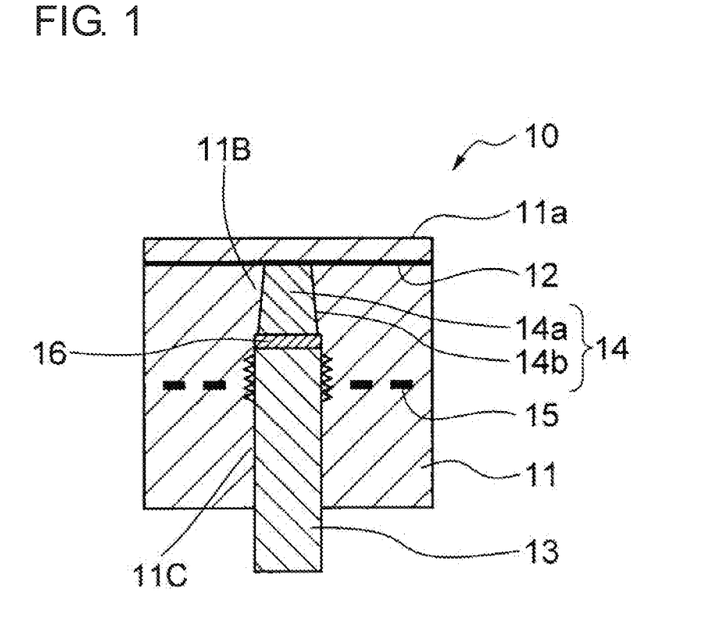
FIG. 1 is a longitudinal sectional view partially and schematically illustrating a first specific example of a wafer holding unit according to the present invention.

To check the advantages of the present invention, a wafer holding unit according to the first specific example of the present invention, such as that shown in FIG. 1, was fabricated and operated. More specifically, three disk-shaped substrates made of aluminum nitride (AlN) and having an outer diameter of 330 mm and individually having a thickness of 9 mm, 5 mm, and 9 mm were prepared. Among these three disk-shaped substrates, a tapered through-hole having an average inner diameter of 4 mm was provided in one ceramic substrate having a thickness of 9 mm, and a truncated conical member made of aluminum nitride and having the same taper angle as that of this through-hole was prepared. A tungsten paste was applied to the lateral surface of this truncated conical member and was then fired, thereby forming a metal layer having a thickness of 0.03 mm.

The truncated conical member having the metallized lateral surface was inserted into the through-hole of the ceramic substrate and was fixed therein. Patterning layers of a tungsten paste for forming an RF electrode and a heater electrode were applied to the front and back surfaces of the ceramic substrate by screen printing and were then fired, thereby forming electrodes. Then, the above-described ceramic substrate having a thickness of 5 mm was overlaid on one of the front and back surfaces of the ceramic substrate on which the RF electrode was formed, while another ceramic substrate having a thickness of 9 mm was overlaid on the other one of the front and back surfaces of the ceramic substrate on which the heater electrode was formed. In this state, the three ceramic substrates were hot-pressed so as to be integrated into one ceramic substrate.

Then, a counterbore was formed by machining from the lower surface of this integrated substrate toward the truncated conical member, so that the lower end of the truncated conical member was exposed together with the metal layer coating the lateral surface of the truncated conical member. Then, a tungsten paste was applied to the lower end of the exposed metal layer and truncated conical member, so that a tungsten-made disk member having an outer diameter of 5.0 mm and a thickness of 1 mm was bonded to the exposed metal layer and truncated conical member. Then, while screwing a tungsten-made metal terminal having a threaded leading end into this counterbore, this threaded leading end was caused to abut against the lower surface of the tungsten-made disk member. The heater electrode was exposed by the formation of a screw hole from the lower surface of the substrate, and was then connected to the tungsten-made metal terminal by screwing the tungsten-made metal terminal into the screw hole.

A tubular support member was attached to the lower surface of the wafer holding unit fabricated as described above, and the wafer holding unit with the tubular support member was placed within a vacuum chamber of a semiconductor manufacturing device. Conductive wires were caused to pass through this tubular support member and were connected to the metal terminal protruding from the lower surface of the wafer holding unit. Then, by supplying power to the conductive wire for the heater electrode under a vacuum atmosphere, the temperature of the wafer holding unit was raised to 550° C., and then, while maintaining the temperature at 550° C., an alternating current voltage of 1600 W and 13.56 MHz was applied from the conductive wire for the RF electrode and was repeatedly turned ON (60 seconds) and OFF (30 seconds) ten thousand times. As a result of this, it was found that the wafer holding unit was operated under good conditions without any failures, such as overheating and cracks.

REFERENCE SIGNS LIST 10, 20, 30, 40 wafer holding unit
11, 21, 31, 41 substrate
11a, 21a, 31a, 41a wafer mounting surface
12, 22, 32, 42 RF electrode
13, 23, 33, 43 metal terminal
14, 24, 34, 44 connecting terminal
14a, 24a, 34a, 44a ceramic member
14b, 24b, 34b, 44b metal layer
15, 25, 35, 45 heater electrode
16, 26, 36, 46 metal member
37, 47 sealing member
38, 48 glass
49 loop-like member
130, 230, 330 wafer holding unit
140, 240, 340 wafer holding unit
233, 333 metal terminal
233a, 333a flange
A corner

The invention claimed is:

1. A wafer holding unit comprising:
a disk-shaped ceramic substrate having an upper surface and a lower surface, with a wafer mounting surface defined on the upper surface and a counterbore open to the lower surface;
an RF electrode embedded within the substrate; and
a metal terminal inserted into the counterbore from the lower surface of the substrate, and a connecting terminal which electrically connects the RF electrode and the metal terminal with each other,
wherein the connecting terminal is constituted by a ceramic member and a metal layer, the ceramic member being made of the same material as the substrate, the metal layer covering a surface of the ceramic member, and an upper end of the metal layer is connected to the RF electrode, while a lower end of the metal layer is connected to the metal terminal with a metal member interposed therebetween, and
wherein the ceramic member has a truncated conical shape.

2. The wafer holding unit according to claim 1, wherein the metal terminal is mechanically screwed with the substrate or the metal member.

3. The wafer holding unit according to claim 2, further comprising a heater electrode, or an electrostatic chuck electrode.

4. The wafer holding unit according to claim 1, further comprising a heater electrode, or an electrostatic chuck electrode.

5. A The wafer holding unit, comprising:
a disk-shaped ceramic substrate having an upper surface and a lower surface, with a wafer mounting surface defined on the upper surface and a counterbore open to the lower surface;
an RF electrode embedded within the substrate on a level parallel with the wafer mounting surface; and a metal terminal inserted into the counterbore from the lower surface of the substrate, and a connecting terminal which electrically connects the RF electrode and the metal terminal with each other, wherein the connecting terminal is constituted by a ceramic member and a metal layer, the ceramic member being made of the same material as the substrate, the metal layer covering a surface of the ceramic member, and an upper end of the metal layer is connected to the RF electrode, while a lower end of the metal layer is connected to the metal terminal with a metal member interposed therebetween, and wherein the ceramic member has a truncated conical shape.

6. The wafer holding unit according to claim 5, wherein the metal terminal is mechanically screwed with the substrate or the metal member.

7. The wafer holding unit according to claim 6, further comprising a heater electrode, or an electrostatic chuck electrode.

8. The wafer holding unit according to claim 5, further comprising a heater electrode, or an electrostatic chuck electrode.

\* \* \* \* \*